United States Patent [19]

Corley

[11] Patent Number: 5,077,154
[45] Date of Patent: Dec. 31, 1991

[54] SOFT EDGE MASK

[76] Inventor: Ferrand D. E. Corley, 80 Kleins Crescent, Kleinberg, Ontario, Canada

[21] Appl. No.: 268,681

[22] Filed: Nov. 7, 1988

Related U.S. Application Data

[63] Continuation of Ser. No. 82,202, Aug. 6, 1987, abandoned.

[30] Foreign Application Priority Data

Aug. 8, 1986 [CA] Canada .................................. 515636

[51] Int. Cl.$^5$ .......................... G03F 9/00; G03B 27/28
[52] U.S. Cl. .......................................... 430/4; 430/333; 430/394; 430/396; 430/397; 430/494; 353/29; 353/30; 354/120; 355/70; 355/125
[58] Field of Search ............... 354/121, 122, 123, 125, 354/120; 353/29, 30, 68, 71; 355/40, 71, 70, 125; 430/6, 397, 333, 4, 5, 9, 321, 396, 494, 398

[56] References Cited

U.S. PATENT DOCUMENTS

| | | | |
|---|---|---|---|
| 4,093,460 | 6/1978 | Weinstein | 350/314 |
| 4,165,163 | 8/1979 | Lemanski | 354/122 |
| 4,208,811 | 6/1980 | Junowicz | 430/396 |
| 4,272,186 | 6/1981 | Plummer | 355/34 |
| 4,284,715 | 8/1981 | Horst | 430/395 |
| 4,298,274 | 1/1981 | Rees et al. | 355/71 |
| 4,301,232 | 11/1981 | Kullen | 430/300 |
| 4,374,911 | 2/1983 | Hartley | 430/5 |
| 4,423,939 | 1/1984 | Hayles | 354/122 |
| 4,440,840 | 4/1984 | Yamaguchi | 430/4 |
| 4,600,606 | 7/1986 | Zink | 430/6 |

Primary Examiner—Jose G. Dees
Assistant Examiner—Donald J. Laney

[57] ABSTRACT

A soft edge mask comprises a panel having an opaque area forming a mask portion and defined by a clearly focussed edge of a predetermined shape, a transparent area forming a clear portion defined by a clearly focussed edge of the same said predetermined shape, and a margin portion extending between the opaque portion and the clear portion, the margin portion having a light transmissability varying progressively from the edge of the mask portion to the edge of the clear portion, and, at each position between the mask portion and the clear portion, being clearly focussed and having the same said predetermined shape.

23 Claims, 4 Drawing Sheets

SOFT EDGE MASK

This application is a continuation of application Ser. No. 07/082,202, filed Aug. 6, 1987 now abandoned.

The invention relates to masks for use with photographic slides in slide projectors, and in particular, to masks wherein the edges of the image are "soft".

BACKGROUND OF THE INVENTION

When designing a visual slide projector show, which may or may not include audio effects as well, it is the practice to use multiple slide projectors, and it is the practice to fade one image on another to produce pleasing aesthetic visual effects. It is also the practice to provide for portions of one slide to be projected on the screen simultaneously with portions of another slide. Three, or up to thirty or more, image portions from different slides may be projected either simultaneously or sequentially. In these cases, it is also the practice to fade the portions of the different images in sequence so as again to provide a pleasing effect on the screen.

In order to avoid unsightly gaps or spaces, image portions from separate slides are projected simultaneously, with adjacent images overlapping. It is the practice to provide a "mask", masking out a portion of one of the images, so that a portion of the other image may be projected into the masked out portion. Similarly, the other slide will have image portions which are not masked out, so that only that portion is projected which will fit the masked out portion in the first image.

Essentially what is done is to create a "hole" in one image, and to create a portion of the other image which will fit the "hole", and overlap at the adjoining edges.

Where there are two portions of two different images overlapping on the same area of the screen at the same time the screen will be confused and may be excessively bright. This is undesirable and produces a sloppy result.

If it is attempted to reduce the marginal overlap to a minimum, it is difficult to align all of the projectors in the array of projectors required for a multiple image show so that the masks of different slides register precisely.

In order to overcome the problem, it has become common to use masks with blurred edges or what are known in the trade as "soft-edge masks". These masks have an image or shape in which the main portion of the mask area is either totally black, or totally transparent, and in which marginal areas represent a transition from black to transparent. The margins of the two masks overlap each other on the screen and reduce the illumination in the overlapped portion so as to equalize it with the illumination in the separate images. Such masks enable the producer of the slides to produce a multiple slide show in which the problem of registering the masked areas is less acute than when using hard edge masks.

However, such soft edge masks in the past have been manufactured by a somewhat rough and ready haphazard method, which resulted in an undesirable loss of sharpness or resolution of the shape of the mask. The process for such manufacture involved simply placing in front of a hard edge mask a panel of light diffuser material, such as translucent milky white acrylic plastic, or a panel of opalescent glass. The sharpness of the mask image is then blurred or diffused around the edges, and when photographed, produces a mask shape which is less well defined, and has a border area which gradually changes from black to transparent.

The use of a light diffuser panel results in a severe loss of resolution of the shape of the mask. When tested for resolution, it is found that these marginal portions have a resolution of less than 5 line pairs per millimeter. This is not a serious problem if the mask is a simple circle or oval. However, where the mask shape has angular corners, then the diffuser panel produces a severe distortion, such that the angular corners become rounded. This produces an unsightly result, when the two masks are projected on the screen in the manner described above. In addition, the use of a diffuser panel, in the manufacturing process caused some random scattering of light in the portion of the mask which was intended to be totally opaque. As a result soft edge masks produced by this method were lacking in contrast.

Other soft-edge masks have been made by simply photographing a "target" or object, with the camera lens out of focus. This however also produces loss of resolution and is unsatisfactory.

Another disadvantage of this type of soft edge mask is the fact that the transition from black to transparent, across the marginal area of such masks was not produced in a regular progressive fashion, since it was dependent simply on the scattering effect of the light diffuser panel. As a result, even if the two masks were registered more or less perfectly, the transitional area might exhibit some irregularities, with some patches being darker and others lighter.

In practice, however, perfect matching or registering of the two masks is virtually impossible, and some variation in the illumination of the overlapped area on the screen is noticeable, when using this type of mask.

Under ideal conditions, the transitional or marginal area of the mask, if examined from the totally black edge to the transparent edge, would exhibit a point more or less midway between the two edges which was capable of transmitting fifty percent of the light from that projector in which the mask was placed. In theory, this fifty percent point should be equidistant from the totally black edge, all the way around the shape of the mask. Assuming the two masks are perfectly registered, then this fifty percent point will coincide precisely on the screen, so that each of the two masks is transmitting fifty percent of the light from its projector at that point. The screen will thus receive fifty percent of the total projector illumination from the two projectors at that point. If this could be achieved, then the marginal area between the two images on the screen would be perfectly progressive from one image to the other and would be evenly illuminated. As noted above, however, since perfect registration is virtually impossible, there is almost always a certain degree of variation in the illumination of the overlapped area, which is difficult, if not impossible, to avoid, using current practice.

It is clearly desirable to provide a soft image mask which overcomes these various problems. In particular, such a soft image mask should avoid the loss of definition or resolution of the shape of the mask which is inherent in the use of a light diffuser panel.

Furthermore, would be desirable if the soft edge area of the mask could be produced in a precise and controlled manner, so that a controlled and predictable density would be produced from one edge to the other of the soft edge.

Furthermore, it is desirable that the soft edge be produced in such a way that the fifty percent point is essentially stretched or widened so that in spite of misregistration of the two masks, the appearance on the screen will nonetheless be virtually indistinguishable from a perfectly registered pair of masks.

BRIEF SUMMARY OF THE INVENTION

With a view to overcoming the foregoing disadvantages, the invention therefore comprises a soft edge mask comprising a panel, a mask portion defined by a substantially opaque area of said panel, a clear portion defined by a substantially light transmitting transparent portion of said panel, and a margin portion extending between said opaque portion and said transparent portion, said margin portion having a light transmissability varying progressively from said mask portion to said transparent portion, and having a resolution in excess of thirty line pairs per mm.

More particularly, it is an objective of the invention to provide a mask having the foregoing advantages wherein the margin portion comprises a plurality of strips of progressively varying light transmissability.

More particularly, it is an objective of the invention to provide a mask having the foregoing advantages wherein the marginal portion is made up of a plurality of separate photographic exposures.

More particularly, it is an objective of the invention to provide a mask having the foregoing advantages, and including a median band strip in said margin portion wherein the light transmissability is almost regular across its width and is substantially fifty percent of the light transmissability of the transparent portion.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the invention.

IN THE DRAWINGS

DESCRIPTION OF THE PREFERRED EMBODIMENT

Figure 1:
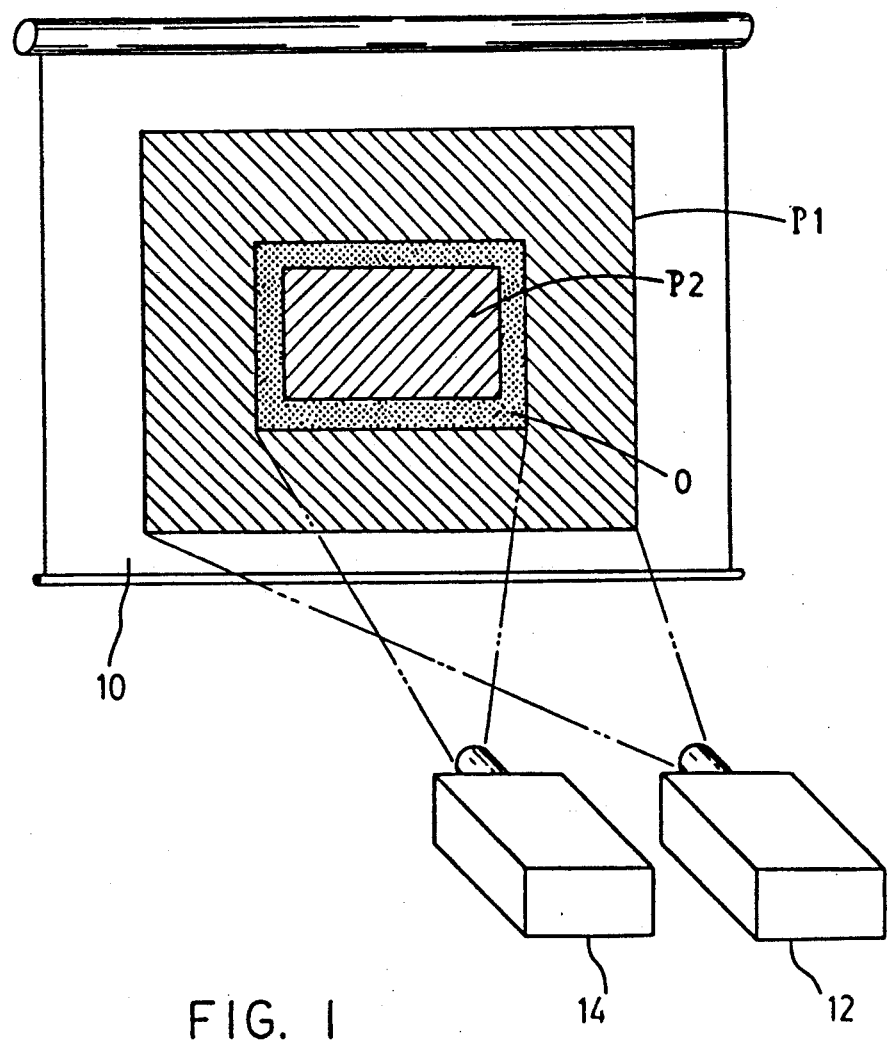
FIG. 1 is a perspective schematic illustration showing a screen and two projectors.

Referring first of all to FIG. 1, it will be seen that a simplified form of multiple projection arrangement would comprise a screen indicated generally as 10, a first projector 12, and a second projector 14.

In practice, it will of course be appreciated that there may be many more projectors than two in such a multiple projection system, up to thirty or even more having been used in some cases.

The screen itself may be a single image screen, or may be a multi-image screen, receiving two, three or more slide images simultaneously. All of the projectors are focused and aligned so that the images projected by each projector will either fill the screen, or at least overlap portions of images from another projector, or projectors.

On the screen is shown an image portion P1 from projector 12, and an image portion P2 from projector 14, each portion being of a clearly defined focussed shape so as to produce a defined image on the screen.

The two image portions overlap in the overlap area O.

The slides (not shown) in the two projectors will be sequenced and arranged so that as the projections alternate from one to the other, the image seen on the screen may be either 100 percent from one projector or the other, or may be a combination of two images from the two projectors. This is the simplest combination of projectors. Much more complex combinations of larger numbers of projectors, and larger screens are commonly used. In a typical merge or "fade", an image from projector 12 may fill all but one edge of the screen, and the image from projector 14 will fill that one edge.

In the next two slides in sequence, in their respective projectors, the first image will shrink and the second image will grow, and so on until the second image fills the entire screen.

This effect is of course well known, and is described here merely for the sake of completeness, so as to obtain a full understanding of the value of the invention.

Shifting one image in a linear fashion is known in the trade as a "wipe".

Other forms of merge may cause the new image to grow, for example, from the centre of the screen, progressively outwardly, and that is sometimes known as a "zoom".

In order to provide a marginal area between the two image portions, which is pleasing to the eye, "soft edge masks" are used in the two slides. The effect of these masks is to cut down the area of the images shown in both slides, so that only minor edge portions of the those two images overlap. In order to do this, two masks are provided, one to mask out the non-image portion of the slide in the first projector and the other to mask out a non-image portion of the slide in the second projector.

By providing successive slides in each projector in which the masks progressively vary in size, or location, the two images can be merged or made to appear as if they move across the screen (wiped) or grow, or shrink (zoomed).

As noted above, this type of multiple image projection display is well known, and the masking and merging of images is also well known and understood in the art.

Referring now to FIGS. 2 and 3, these figures illustrate two typical complementary slides.

Figure 2A:
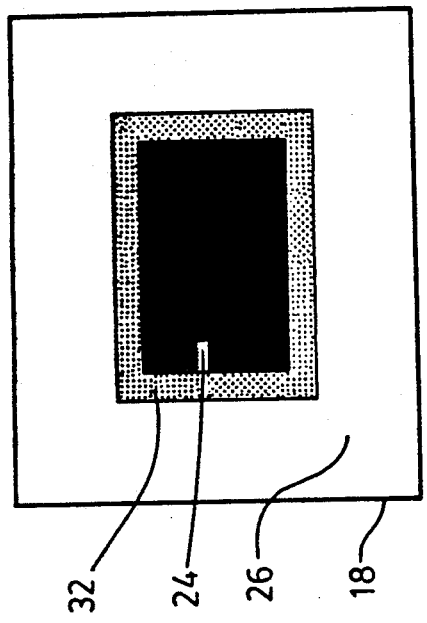
FIGS. 2a and 2b show the make up of a slide in a first projector.
Figure 2B:
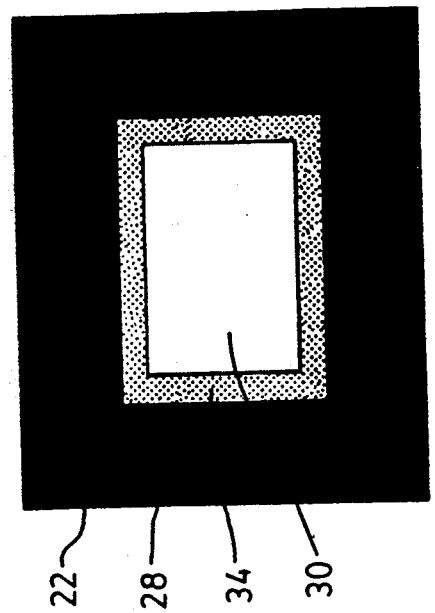

The slide for projector 12 for example is shown in FIGS. 2a and 2b, and will comprise a panel of photographic material 16, having a first image (not shown), and a panel of photographic material 18, comprising the mask.

Figure 3A:
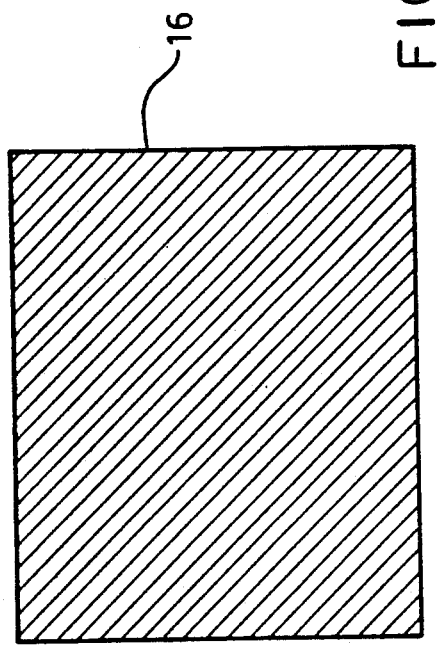
FIGS. 3a and 3b show the make up of a slide in a second projector.
Figure 3B:
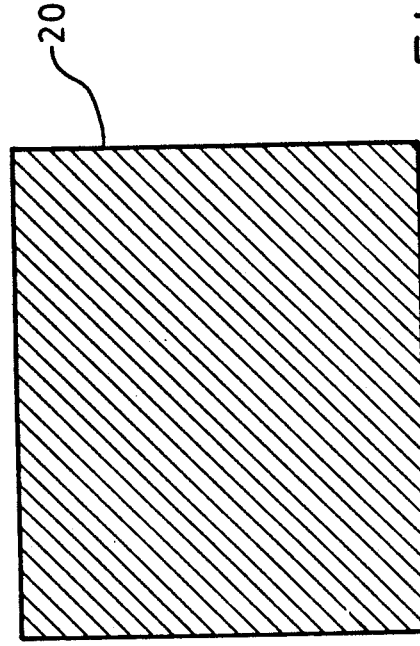

As shown in FIG. 3a and 3b, the slide for the second projector comprises an image panel 20, and a mask panel 22.

It will be noted that the two mask panels are complementary. Thus, mask panel 18 has a central rectangular opaque portion 24 and a peripheral transparent portion 26. Mask panel 22 has a peripheral opaque portion 28 and a central rectangular transparent portion 30. Each of the opaque and transparent portions has a clearly defined focussed shape to produce a defined image.

In order to provide for a smooth transition between the two images when both slides are projected simultaneously from two projectors, the masks are provided with margin portions 32 and 34 respectively. Each of the margin portions provides a smooth progressive transition from opaque to transparent. Assuming the light transmissability of the opaque portion is 0 percent and the light transmissability of the transparent portion is substantially 100 percent, then the light transmissability of the margin portion will vary progressively from about 1 percent to about 99 percent.

Figure 4:
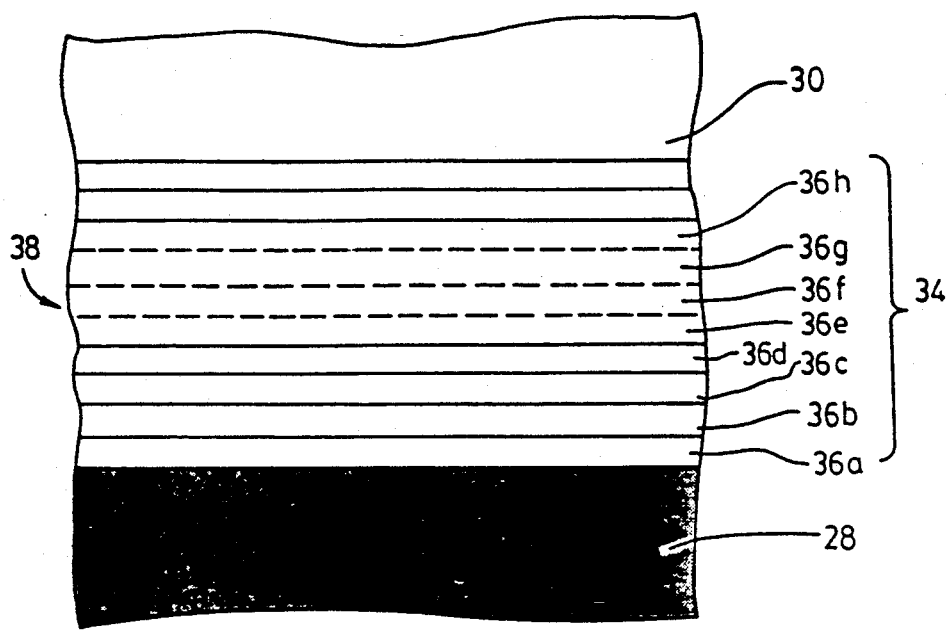
FIG. 4 is a greatly enlarged view of the margin portion of a mask.
Figure 5:
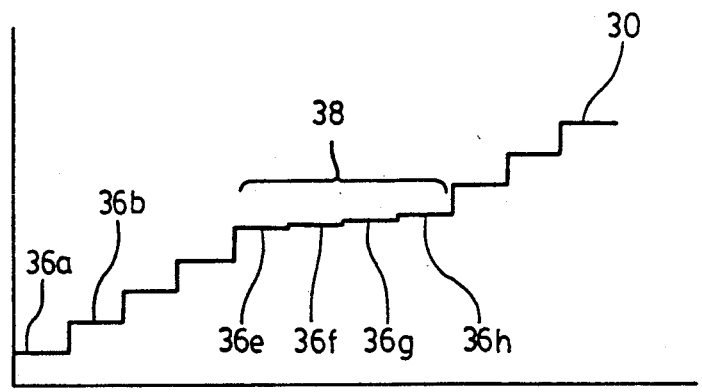
FIG. 5 is a graph illustrating the light transmissability of the margin portion of a mask.

Referring now to FIGS. 4 and 5, the margin portion 32 and 34 of each of the masks 18 and 22 is illustrated in enlarged and somewhat schematic form. For the sake of simplicity, the reference numerals in FIG. 4 are taken from FIG. 3b. However, the margin portion 32 of FIG. 3b is also made up in the same way, and the following description must be understood in the sense that it refers to both FIGS. 2b and 3b.

Thus, in FIG. 4, the opaque portion 28 and the transparent portion 30 are shown separated by the margin portion 34. The margin portion 34 is shown in this embodiment to be made up of a plurality of separate strips indicated as 36a, 36b, 36c, etc. Each of the strips 36 is located at predetermined regular spacing from the opaque portion 28, and each of the strips 36 has a high degree of resolution of the shape of the opaque portion 28. The light transmissability of each of the strips 36a, b, c, etc., is regular and even throughout its extent, and diminishes progressively in increments starting as almost black adjacent the opaque portion 28, and becoming virtually transparent adjacent the transparent portion 30.

In this way, the entire margin portion 34 provides an even regular gradation of light transmissability and at the same time provides a high degree of resolution of the image.

Because the manufacturing process allows accurate control of the focussing of the lens, the image is sharply and accurately defined at both edges of the margin, i.e., its edge at the transparent portion and its edge at the opaque portion.

It will of course be understood that somewhere between the opaque portion 28 and the transparent portion 30, one of the strips 36 will transmit approximately 50 percent of the light transmitted by the transparent portion 30.

As mentioned above, it is highly desirable if this "50 percent point" can be precisely registered with the 50 percent point of the margin 32 of the other mask, when the two images are projected on the screen simultaneously.

Since the individual strips 36a, b, etc., are narrow, it is in practice extremely difficult to achieve a precise registration.

Therefore, in accordance with a specific object of the invention, the 50 percent portion of the margins 32 or 34 is "stretched", that is to say it forms a band somewhat wider than any one of the individual strips 36.

In FIGS. 4 and 5, this 50 percent band is indicated as 38. It will be seen as having a width which is approximately equal to the width of about four of the adjacent strips 36.

The light transmissability of the band 38 is so produced and regulated that it is not precisely 50 percent all across its width, but represents a more gradual rate of change than that between the remainder of strips 36a, b, etc.

The band 38 in this embodiment is in fact made up of several strips 36e, f, g, h each having a density, or light transmissability progressively varying only slightly from the next. The increment of variation between the strips 36e, f, g, h in the band 38 is much smaller than the increment of variation between strips 36a, b, c, etc.

This increase in width is shown merely by way of example. The precise width of the 50 percent band in either of the margins 32 or 34 will depend upon the result desired to be achieved, but it is in any event wider than the other strips 36.

For the purposes of completeness, a graphic representation of the typical light transmissability of the portions 32 and 34 is shown in FIG. 5. Thus, the extreme left hand side of the graph represents the minimum light transmissability of the first strip 36a. The 50 percent band is represented as having a width equal to approximately that of four of the other strips 36.

It will of course be appreciated that the designations a, b, c, d, e, etc., are purely by way of example and for the sake of simplicity in explanation.

In a commercial form of soft edge mask according to the invention there may be from fifty to two hundred or more separate strips 36 in any one marginal portion of a soft edge mask. In this case, the variation in light transmissability between one such strip and another would be in the region of between 2 percent and 0.5 percent.

To the naked eye, the end result as projected on the screen of a typical multi-image projection system is such as to produce a smooth merge or blend from one image to the other, in which the illumination on the screen in the merged portion of the two images is more or less equal to the illumination falling on the screen in each of the separate images.

It will be understood that this is the result of the fact that the two projectors are both capable of producing 100 percent illumination on the screen. Since however the two images do not cover the whole screen simultaneously, there is 100 percent illumination from projector 12 on its portion of the screen, and 100 percent illumination from projector 14 on its portion of the screen, and if it were not for the use of the masks, there would be about 200 percent illumination where the two images overlap. In this overlap area, the effect of the two masks is, however, to reduce the total illumination, at any given point in the overlap, to about 100 percent. Thus, all across the margin portion, substantially 100 percent illumination is being received, by the combination of the illumination from both projectors simultaneously.

Thus by the practice of the invention, the two images, and the overlapping margin portions, are all illuminated to essentially the same extent across the entire screen. At the same time, the problem of registration of the two mask areas is substantially reduced. In addition, by reason of the increased resolution and definition of the two mask areas in the two masks, a greatly improved appearance is provided. In addition, it becomes possible to use masks of almost any variety of shapes, such as rectangles, squares, stars, and the like, which would not have been possible to any satisfactory degree in accordance with prior art methods.

It will also be appreciated that while the margin portion, as illustrated in FIGS. 4 and 5 is shown as having distinct steps or gradations from one strip to another, it will be possible to provide such a mask in which there is a smooth regular degree of change without the distinct strips of variations.

Figure 6:
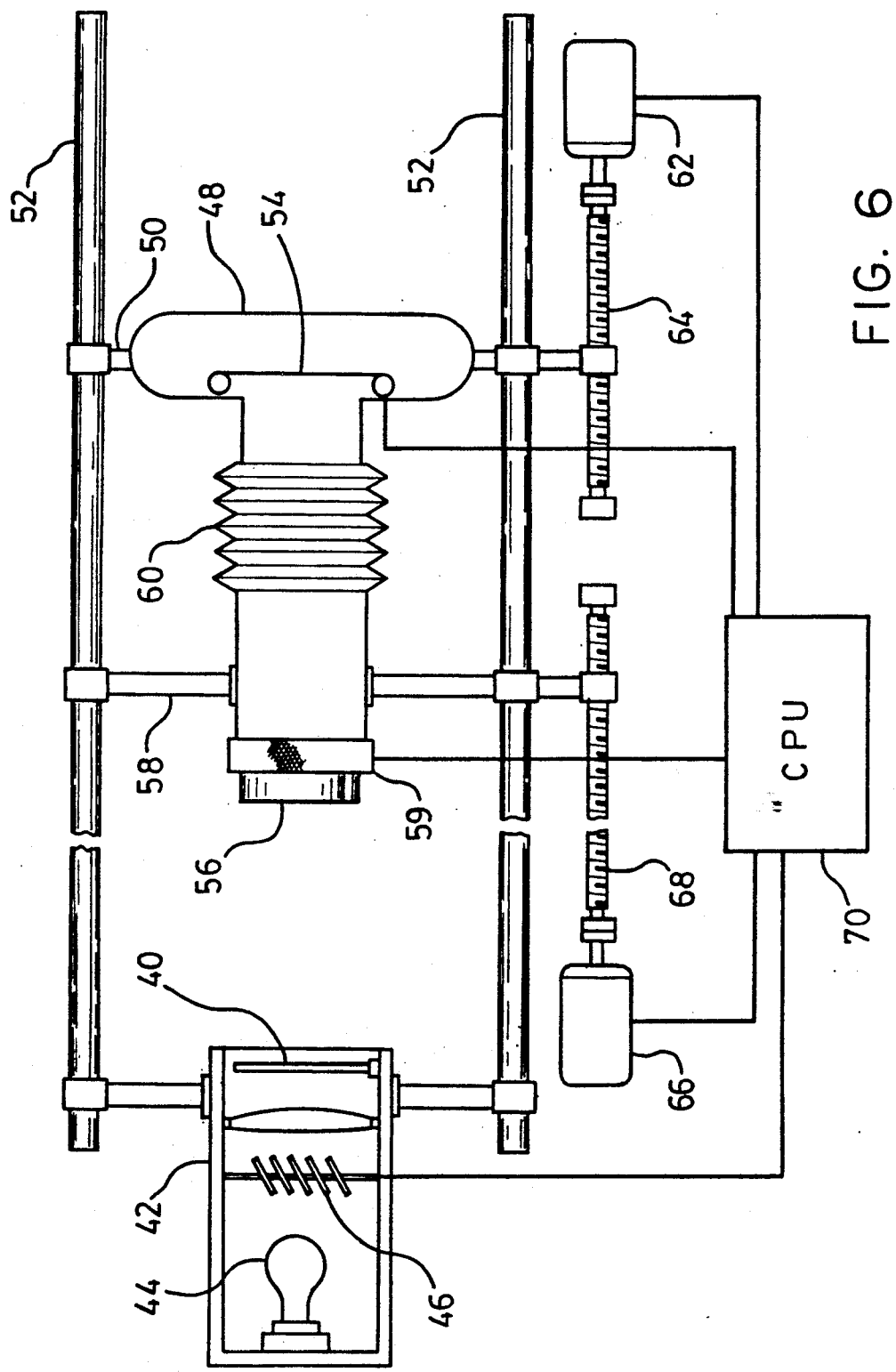
FIG. 6 is a schematic illustration showing the method of manufacture of a mask, and, FIG. 7 is a graph showing typical loss of resolution when using a prior art diffuser panel.

This will become more apparent from a study of FIG. 6, and the method of production of the masks.

Master masks can be produced by taking a series of separate photographic exposures, at different distances from an object. Alternatively, the master masks can be produced by progressively and continuously increasing or decreasing the size of an object, as seen by the camera (i.e., zooming in or out), while continuously exposing a portion of photograhic film to the object.

Both of these basic methods can be achieved by means of the apparatus shown in FIG. 6. As shown in FIG. 6, the apparatus will be seen to comprise an object 40, mounted in a projector 42 and illuminated by a lamp 44. The illumination from the lamp 44 may be regulated and adjusted by means of the blind 46.

In most cases, the object 40 will consist of a piece of photographic film, on which has been produced an image in the shape of the mask which is to be produced. This image can be any shape desired, for use in the final multi-projector display system.

A camera body 48 is shown mounted on a support 50 which is in turn carried on a pair of rails 52. Camera 48 has a shutter 54, which is provided with any suitable form of adjustment means to adjust the exposure in any suitable manner such as is well known in the art.

A lens 56 is shown mounted on a carrier 58 which is in turn slidably mounted on the rails 52. Lens 56 may have a zoom adjustment 59 if desired. It will also incorporate the usual iris (not shown), such as is well known in the art. Normally, a bellows or other form of light screen 60 will be provided between the lens 56 and the camera 48. However, this will not be necessary in all cases since in accordance with the invention the entire procedure may be carried out in a dark room.

Camera 48 may be movable along rails by means of the electric motor 62 and the threaded rod 64. The lens 56 may be movable along the rails 52 by means of the electric motor 66 and the threaded rod 68. A central process controller, typically a personal computer, is indicated generally as 70. It may be programmed to control the blind 46, the shutter 54, the zoom 59 and the motors 62 and 66.

In order to produce the stepped form of margin as shown in FIGS. 4 and 5, the camera 48 is loaded with film, and the lens 56 and camera 48 are adjusted so as to take a sharp, clear exposure of the mask object 40 and an exposure is then made on a frame of the film. The lens 56 is then moved a predetermined increment towards (or away from) the object 40, and the camera 48 is also moved a suitable distance so as to ensure that a sharp image falls on the focal plane of the camera. Another exposure is then taken with the exposure time reduced on the same frame (without advancing the film). The lens 56 and camera 48 are again moved and further exposure is taken for a reduced time, and so on. In this way, a whole series of separate exposures at different durations are taken all on the same film frame, and without advancing the film. Thus by means of moving the lens 56 and camera 48 in steps towards (or away from) the object 40, the margin can be produced photographically around the exterior or interior of the photograph of the mask object 40.

The distance of movement of the lens 56 and camera 48, and also the timing of the exposure achieved by the shutter 54 can all be regulated by the controller 70. The movement of the blind 46 may also be regulated so as to reduce or increase the degree of illumination of the object 40, to compensate for the changing distance.

Thus, the apparatus may be programmed to produce a series of progressive and individually focussed exposures on a single film frame which will provide a stepped margin as shown in FIGS. 4 and 5.

The wider 50 percent band is produced by simply taking a series of exposures, in which the exposure time change between exposures is reduced. This will produce a series of strips in which the density, and hence light transmissability, exhibits a smaller degree of variation than in the remainder.

The end result is a photograph which may be fifty to two hundred or more separate exposures, on a single piece of film. This is the "master" mask, and may be either a negative or a positive. Prints are then made to provide quantities of soft edge masks as needed for customers by conventional methods.

It will of course be appreciated, however, that it is possible to produce the margin portion without having a series of separate strips or bands. Thus it is also possible to move the lens 56 and camera 48 continuously, and also to adjust the amount of illumination of the object 40 by means of the blind 46 in a continuous fashion, such that the exposure for the margin takes place in a continuous manner rather than in a series of stepped exposures. In this case, of course, the shutter 54 would be left open, so that there would not be a series of separate exposures, but one long exposure.

Using this system the margin portion will vary continuously, without strips or bands.

Substantially the same results can be achieved in both the system of stepped exposures and in the system of continuous variation in size of the object, and continuous exposure, by means of moving the zoom adjustment 59 on the lens 56. In this case, it not be necessary to move the lens 56 physically towards or away from the object 40. All that is required is simply to zoom in or zoom out.

Obviously, this can be done in a series of steps with separate stepped exposures. Alternatively, it can be done as a continuous function, with the shutter left open, so that there is only a single exposure over a period of time.

It is also possible to move the object itself relative to the camera and lens. However this is less practical than the methods described above.

In each case, however, it will be noted that the progressive variation in the margin of the mask is achieved without any degradation of resolution. In each case, it is achieved by a precise application of photographic techniques which will result in a clear sharp image with a high degree of resolution.

In practice, masks produced in accordance with the invention can easily be achieved having a degree of resolution of at least thirty, and usually in excess of forty line pairs per mm.

By comparison, soft image masks produced in accordance with prior art techniques my means of light diffusion plates, produced marginal areas, and mask shapes which had a very low degree of resolution, typically being in the region of five line pairs per mm or less.

As noted above, where the shape of the mask was circular or oval, this did not present too much of a problem. However, where it is desired to provide mask areas of other shapes such as rectangular, triangular, star shaped, or the like, the prior art systems fell far short of what was desirable and produced inferior results.

The loss of resolution was generally dependent on the degree of light diffusion produced by the diffuser panel. Generally, the thicker the panel, the greater the diffusion, and thus the greater the loss of resolution.

If the panel was too thin, then insufficient diffusion took place, and the soft edge margin was ineffective.

Tests indicate that even when using a thin light diffuser panel, a major loss of resolution took place.

Figure 7:
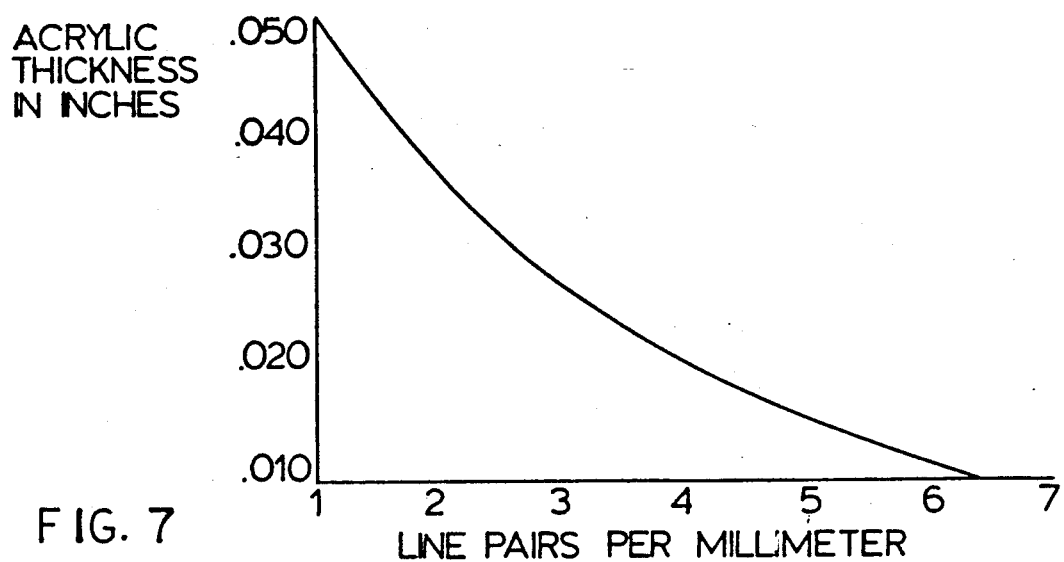

A curve showing test results on typical diffuser panels, is shown in FIG. 7.

FIG. 7 represents a plot of typical loss of resolution when a thin opalescent acrylic panel is sandwiched with a resolution chart calibrated in line pairs per MM.

Resolution of masks produced by the invention may be produced which is equivalent to typical resolution of normal black and white photography. This is dependent on film quality, and lens performance.

Given good quality film, and a high performance lens, resolutions of 80 line pairs per mm, and better, are regularly achieved.

However, resolutions as low as 30 line pairs per mm are found to be acceptable in many cases.

The foregoing is a description of a preferred embodiment of the invention which is given here by way of example only. The invention is not to be taken as limited to any of the specific features as described, but comprehends all such variations thereof as come within the scope of the appended claims.

What is claimed is:

1. A soft edge mask for use in the projection of a photographic image on to a viewing screen and comprising:
    a panel;
    a continuous mask portion formed by a substantially opaque area of said panel and defined by a clearly focussed edge of a first size and having a predetermined rectangular, triangular, square or star shape;
    a continuous clear portion formed by a substantially transparent portion of said panel and defined by a clearly focussed edge of the same said predetermined shape but having a second size different from said first size; and
    a margin portion extending between said mask portion and said clear portion, said margin portion having a light transmissability progressively decreasing from said transparent portion to said mask portion and, at all positions between said transparent portion and said mask portion, being clearly focussed and having a shape the same as said predetermined shape but being proportionately sized relative to said first and second sizes and intermediate said first and second sizes,
    whereby, when said soft edge mask is used in projecting a photographic image, a first portion of such a photographic image is projected on to such a screen, a second portion of such an image is masked from such a screen, and a marginal portion of such an image between said first and second portions is progressively faded without significant loss of resolution and without significant distortion of said predetermined shape.

2. A soft edge mask as claimed in claim 1 wherein said margin portion; comprises a plurality of strips, each being defined by edges of the same said predetermined shape and said strips being of progressively varying light transmissabilities.

3. A soft edge mask as claimed in claim 2 including a median band in said margin portion and comprising a number of said strips and wherein the light transmissability is about fifty percent of said light transmissability of said clear portion.

4. A soft edge mask as claimed in claim 3 and in which the variation in light transmisability between adjacent said strips within said median band is less than the variation in light transmissabilty between adjacent said strips within said margin portion but outside said median band.

5. A soft edge mask as claimed in claim 1 wherein said mask portion extends continuously around the periphery of said panel, wherein said clear portion is located within and is enclosed by said mask portion, and wherein said margin portion extends from an inner said edge of said mask portion inwardly to an outer said edge of said clear portion.

6. A soft edge mask as claimed in claim 1 wherein said clear portion extends continuously around the periphery of said panel, wherein said mask portion is located within and is enclosed by said clear portion, and wherein said margin portion extends from an inner said edge of said clear portion to an outer said edge of said mask portion.

7. A soft edge mask as claimed in claim 1 and in which the light transmissability of said margin portion varies continuously between said mask portion and said clear portion.

8. A soft edge mask as claimed in claim 7 and in which said margin portion includes a median band defined by edges of the same said predetermined shape and in which the light transmissability is about fifty percent of the light transmissability of said clear portion.

9. A soft edge mask as claimed in claim 8 and in which the light transmissability of said median band varies more slowly between said edges thereof than does the light transmissability in those portions of the margin portion outside said median band.

10. A soft edge mask as claimed in claim 1, which can be used as a master for making other said soft edge masks, in which said panel is formed of a photographic material, and in which said margin portion comprises a plurality of separate photographic exposures each being of the same said shape and each being clearly focussed on said panel during said exposures.

11. A soft edge mask which is a reproduction of a soft edge mask as claimed in claim 10.

12. A soft edge mask as claimed in claim 1, which can be used as a master for making other said soft edge masks, in which said panel is formed of a photographic material, and in which said margin portion comprises a single photographic exposure of a constant said shape but of a continuously varying size and which is continuously in clear focus during such exposure.

13. A soft edge mask which is a reproduction of a soft edge mask as claimed in claim 12.

14. A master soft edge mask for use in the manufacture of soft edge masks for use in turn in the projection of a photographic image on to a viewing screen and which master soft edge mask comprises:
    a panel of photographic material;
    a continuous mask portion formed by a substantially opaque area of said panel and defined by a clearly focussed edge of a first size and having a predetermined shape;

a continuous clear portion formed by a substantially transparent portion of said panel and defined by a clearly focussed edge of the same said predetermined shape but having a second size different from said first size; and a margin portion extending between said mask portion and said clear portion, said margin portion having a light transmissability progressively decreasing from said transparent portion to said mask portion and, at all positions between said transparent portion and said mask portion, being clearly focussed and having a shape the same as said predetermined shape but being proportionately sized relative to said first and second sizes and intermediate said first and second sizes, and which master soft edge mask is manufactured by a method which comprises:

positioning a mask object in front of a photographic camera housing a photographic film;

illuminating said mask object;

operating said camera to make a first exposure in turn to provide a clearly focussed photograph of said mask object on a single frame of said photographic film;

adjusting at least one of said mask object and said camera whereby to alter the size of the image of said mask object on said single frame of film;

operating said camera to make a second exposure to provide a clearly focussed photograph of said mask object on the same said frame and;

repeating said steps a predetermined number of times while varying at least one of the illumination of said mask object and the exposure time during said steps to build up a said margin portion comprising a plurality of strips having light transmissabilities varying progressively from almost clear adjacent said clear portion to almost opaque adjacent said mask portion.

15. A master soft edge mask for use in the manufacture of soft edge masks for use in turn in the projection of a photographic image on to a viewing screen and which master soft edge mask comprises:

a panel of photographic material;

a continuous mask portion formed by a substantially opaque area of said panel and defined by a clearly focussed edge of a first size and having a predetermined shape;

a continuous clear portion formed by a substantially transparent portion of said panel and defined by a clearly focussed edge of the same said predetermined shape but having a second size different from said first size; and a margin portion extending between said mask portion and said clear portion, said margin portion having a light transmissability continuously and progressively decreasing from said transparent portion to said mask portion and, at all positions between said transparent portion and said mask portion, being clearly focussed and having a shape the same as said predetermined shape but being proportionately sized relative to said first and second sizes and intermediate said first and second sizes, and which master soft edge mask is manufactured by a method which comprises:

positioning a mask object in front of a photographic camera housing a photographc film;

illuminating said mask object to provide a clearly focussed image of said mask object on a single frame of said photographic film;

continuously adjusting at least one of said mask object and said camera whereby to alter the size of said image of said mask object on said single frame of film; and operating said camera to make a continuous exposure of said mask object on the same said frame during said continuous adjustment while continuously varying at least one of the illumination of said mask obect and the effective exposure time to build up a margin portion having a light transmissability varying continuously from almost clear adjacent said clear portion to almost opaque adjacent said mask portion.

16. A soft edge mask manufactured as a reproduction of a master soft edge mask and for use in the projection of a photographic image on to a viewing screen and which master soft edge mask comprises:

a panel of photographic material;

a continuous mask portion formed by a substantially opaque area of said panel and defined by a clearly focussed edge of a first size and having a predetermined shape;

a continuous clear portion formed by a substantially transparent portion of said .panel and defined by a clearly focussed edge of the same said predetermined shape but having a second size different from said first size; and a margin portion extending between said mask portion and said clear portion, said margin portion having a light transmissability progressively decreasing from said transparent portion to said mask portion and, at all positions between said transparent portion and said mask portion, being clearly focussed and having a shape the same as said predetermined shape but being proportionately sized relative to said first and second sizes, and intermediate said first and second sizes, and which master soft edge mask is manufactured by a method which comprises:

positioning a mask object in front of a photographic camera housing a photographc film;

illuminating said mask object;

operating said camera to make a first exposure in turn to provide a clearly focussed photograph of said mask object on a single frame of said photographic film;

adjusting at least one of said mask object and said camera whereby to alter the size of the image of said mask object on said single frame of film;

operating said camera to make a second exposure to provide a clearly focussed photograph of said mask object on the same said frame and;

repeating said steps a predetermined number of times while varying at least one of the illumination of said mask object and the exposure time during said steps to build up a said margin portion comprising a plurality of strips having light transmissabilities varying progressively from almost clear adjacent said clear portion to almost opaque adjacent said mask portion.

17. A soft edge mask manufactured as a reproduction of a master soft edge mask and for use in the projection of a photographic image on to a viewing screen and which master soft edge mask comprises:

a panel of photographic material;

a continuous mask portion formed by a substantially opaque area of said panel and defined by a clearly focussed edge of a first size and having a predetermined shape;

a continuous clear portion formed by a substantially transparent portion of said panel and defined by a clearly focussed edge of the same said predetermined shape but having a second size different from said first size; and a margin portion extending between said mask portion and said clear portion, said margin portion having a light transmissability continuously and progressively decreasing from said transparent portion to said mask portion and, at all positions between said transparent portion and said mask portion, being clearly focussed and having a shape the same as said predetermined shape but being proportionately sized relative to said first and second sizes and intermediate said first and second sizes, and which master soft edge mask is manufactured by a method which comprises:

positioning a mask object in front of a photographic camera housing a photographc film;

illuminating said mask object to provide a clearly focussed image of said mask object on a single frame of said photographic film;

continuously adjusting at least one of said mask object and said camera whereby to alter the size of said image of said mask object on said single frame of film; and operating said camera to make a continuous exposure of said mask object on the same said frame during said continuous adjustment while continuously varying at least one of the illumination of said mask obect and the effective exposure time to build up a margin portion having a light transmissability varying continuously from almost clear adjacent said clear portion to almost opaque adjacent said mask portion.

18. A method of making a master for a soft edge mask having a mask portion, a clear portion of light transmitting transparent photographic film and an intermediate margin portion and which method comprises:

positioning a mask object in front of a photographic camera housing a photographic film;

illuminating said mask object;

operating said camera to make a first exposure in turn to provide a clearly focussed photograph of said mask object on a single frame of said photographic film;

adjusting at least one of said mask object and said camera whereby to alter the size of the image of said mask object on said single frame of film;

operating said camera to make a second exposure to provide a clearly focussed photograph of said mask object on the same said frame and; repeating said steps a predetermined number of times while varying at least one of the illumination of said mask object and the exposure time during said steps to build up a said margin portion comprising a plurality of strips having light transmissabilities varying progressively from almost clear adjacent said clear portion to almost opaque adjacent said mask portion.

19. A method as claimed in claim 18 and which comprises adjusting at least one of said mask object and said camera while varying at least one of said illumination of said mask object and the exposure time during said steps to build up a said margin portion including a median band in said margin portion and comprising a number of said strips and wherein the light transmissability is about fifty percent of said light transmissability of said clear portion.

20. A method as claimed in claim 19 and which comprises adjusting at least one of said mask object and said camera while varying at least one of said illumination of said mask object and the exposure time during said steps to build up a said margin portion including a said median band wherein the variation in light transmissability between adjacent said strips within said median band is less than the variation in light transmissability between adjacent said strips within said margin portion but outside said median band.

21. A method of making a master for a soft edge mask having a mask portion, and a clear portion of light transmitting transparent photographic film and which method comprises:

positioning a mask object in front of a photographic camera housing a photographic film;

illuminating said mask object to provide a clearly focussed image of said mask object on a single frame of said photographic film;

continuously adjusting at least one of said mask object and said camera whereby to alter the size of said image of said mask object on said single frame of film; and operating said camera to make a continuous exposure of said mask object on the same said frame during said continuous adjustment while continuously varying at least one of the illumination of said mask object and the effective exposure time to build up a margin portion having a light transmissability varying continuously from almost clear adjacent said clear portion to almost opaque adjacent said mask portion.

22. A method as claimed in claim 21 and which comprises continuously adjusting at least one of said mask object and said camera while continuously varying at least one of said illumination of said mask object and the effective exposure time to build up a said margin portion which includes a median band in which the light transmissability is about fifty percent of the light transmissablity of said clear portion.

23. A method as claimed in claim 22 and which comprises continuously adjusting at least one of said mask object and said camera while continuously varying at least one of said illumination of said mask object and the effective exposure time to build up a said margin portion which includes a said median band in which the light transmissability varies more slowly between edges thereof than does the light transmissability in those portions of the margin portion outside said median band.

* * * * *